United States Patent
Tsang

(10) Patent No.: US 8,461,607 B2
(45) Date of Patent: Jun. 11, 2013

(54) LIGHT EMITTING DIODE PACKAGE

(75) Inventor: Jian-Shihn Tsang, Taipei Hsien (TW)

(73) Assignee: Hon Hai Precision Industry Co., Ltd., New Taipei (TW)

(*) Notice: Subject to any disclaimer, the term of this patent is extended or adjusted under 35 U.S.C. 154(b) by 270 days.

(21) Appl. No.: 12/980,272

(22) Filed: Dec. 28, 2010

(65) Prior Publication Data

US 2012/0098000 A1    Apr. 26, 2012

(30) Foreign Application Priority Data

Oct. 25, 2010    (TW) ................. 99136269 A

(51) Int. Cl.
*H01L 33/00*    (2010.01)

(52) U.S. Cl.
USPC .............................. 257/98; 257/99

(58) Field of Classification Search
USPC ............... 257/88–103, E33.072, E33.074
See application file for complete search history.

(56) References Cited

U.S. PATENT DOCUMENTS

| | | | |
|---|---|---|---|
| 7,955,878 B2 * | 6/2011 | Harada | 257/98 |
| 8,188,492 B2 * | 5/2012 | Lee et al. | 257/89 |
| 8,269,239 B2 * | 9/2012 | Shylo et al. | 257/98 |
| 8,288,783 B2 * | 10/2012 | Kinomoto | 257/89 |
| 8,324,647 B2 * | 12/2012 | McKenzie et al. | 257/98 |
| 2007/0012940 A1 * | 1/2007 | Suh et al. | 257/99 |

* cited by examiner

*Primary Examiner* — Cuong Q Nguyen
(74) *Attorney, Agent, or Firm* — Altis Law Group, Inc.

(57) ABSTRACT

An exemplary light emitting package includes a base, an LED chip mounted on the base, an encapsulant layer encapsulating the LED chip and a phosphor layer located above and separated from the LED chip. The phosphor layer includes a phosphor scattered portion and a clear portion without phosphor therein. An area of the phosphor scattered portion is smaller than the light emitting area of the encapsulant layer from which light emitted upwardly from the LED chip leaves the encapsulant layer.

15 Claims, 11 Drawing Sheets

LIGHT EMITTING DIODE PACKAGE

BACKGROUND

1. Technical Field

The present disclosure relates generally to light emitting diode (LED) packages, and more particularly to an LED package with improved light emitting efficiency by transmitting an excited light from an LED chip and absorbing the excited light in a phosphor and emitting a wavelength conversion light obtained by converting a wavelength of the excited light.

2. Description of Related Art

LEDs are solid state light emitting devices formed of semiconductors, which are more stable and reliable than other conventional light sources such as incandescent bulbs. Such LEDs emit light close to approximately single color light, which is different from light having a wide light emitting spectrum from incandescent bulbs. Recently, LEDs capable of emitting white light have been developed. A method of obtaining a white LED package is encapsulating a blue LED chip with a phosphor layer where yellow phosphors are scattered. When blue light is emitted from the blue LED chip, yellow light is emitted from the yellow phosphors absorbing the blue light from the blue LED chip, thereby outputting white light by mixing two types of light whose wavelengths are different from each other.

Since a refraction index of the phosphor layer is different from that of the air outside of the LED package, light emitted from the blue LED chip is capable of occurring total internal reflection at an interface between the phosphor layer and the air, and cannot be transmitted outside, resulting in a lower light emitting efficiency.

What is needed therefore is an LED package having an improved light emitting efficiency.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the views.

DETAILED DESCRIPTION

Figure 1:
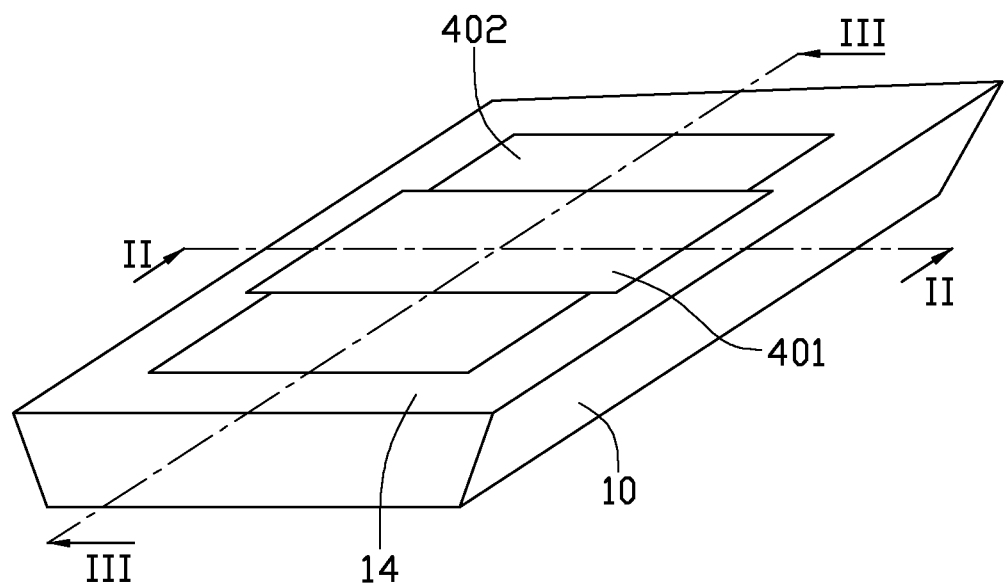
FIG. 1 is an isometric view of an LED package in accordance with a first embodiment of the present disclosure.
Figure 2:
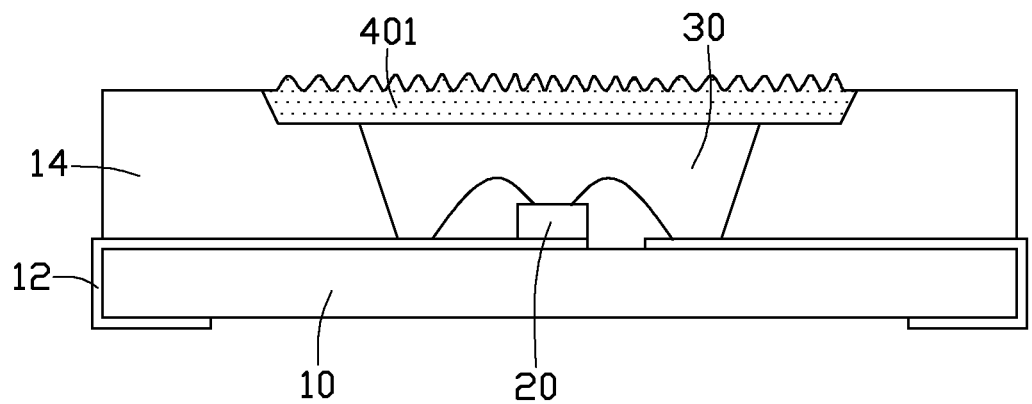
FIG. 2 is a cross sectional view of the LED package in FIG. 1, taken along line II-II thereof.
Figure 3:
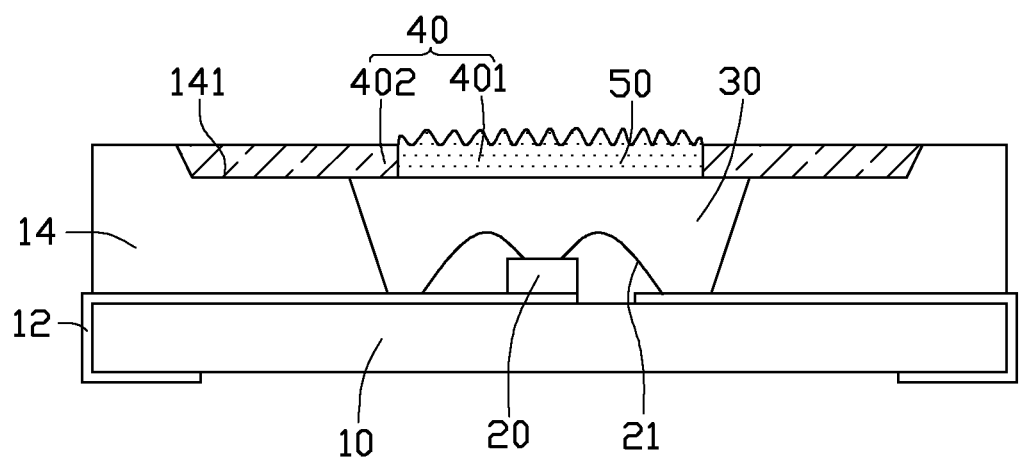
FIG. 3 is a cross sectional view of the LED package in FIG. 1, taken along line III-III thereof.

Referring to FIGS. 1-3, an LED package in accordance with a first embodiment of the present disclosure comprises a base 10, an LED chip 20 mounted on the base 10, an encapsulant layer 30 encapsulating the LED chip 20, and a phosphor layer 40 mounted on the encapsulant layer 30, whereby the phosphor layer 40 is above and separated from the LED chip 20. Light emitted from the LED chip 20 can transmit through the encapsulant layer 30 and the phosphor layer 40 to an outside of the LED package.

The base 10 is made of material with high heat conductivity such as ceramic. Electronic structures 12 are formed on the base 10 by electroplating or evaporating techniques. The electrical structures 12 extend from a top surface of the base 10 to a bottom surface of the base 10, whereby the LED package is formed as a surface mounting type device.

A reflection cup 14 is formed on the top surface of the base 10. A step 141 is defined at a top inner side of the reflection cup 14. The step 141 at a middle portion of two opposite sides thereof is wider than other portions thereof, whereby an opening of the reflection cup 14 is of crossed shape. The material of the reflection cup 14 can be the same as that of the base 10.

The LED chip 20 can emit visible light or ultraviolet light, especially blue light or near ultraviolet light. A light emitting layer of the LED chip 20 can be made of material which is presented by $Ga_{1-x-y}In_xAl_yN$, wherein $0 \leq x \leq 1$, $0 \leq y \leq 1$, $0 \leq x+y \leq 1$. The LED chip 20 is positioned at a bottom of the reflection cup 14 and electrically connected to the electrical structures 12 via wire bonding technique, i.e., the LED chip 20 being electrically connected to the electrical structures 12 by metal wires 21. Besides wire bonding, the LED chip 20 can also be fixed and electrically connected to the electrical structures 12 by flip-flop technique.

The encapsulant layer 30 is received in the reflection cup 14 and covers the LED chip 20 and metal wires 21. A top of the encapsulant layer 30 is flush with the step 141 of the reflection cup 14. The encapsulant layer 30 can be made of transparent material such as resin or silicone.

The phosphor layer 40 can also be made of transparent material. The phosphor layer 40 is configured to be a flat plate and positioned on the encapsulant layer 30 and the step 141 of the reflection cup 14. A top of the phosphor layer 40 is approximately flush with a top of the reflection cup 14. The phosphor layer 40 comprises a phosphor scattered portion 401 and two clear portions 402 without phosphor scattered therein. The phosphor scattered portion 401 comprises phosphors 50 scattered therein. The phosphors 50 can be silicon oxynitride phosphors, nitride phosphors, etc. The clear portions 402 are positioned at two lateral sides of the phosphor scattered portion 401. An incidence angle of the light emitted from the LED chip 20 to the clear portions 402 is larger than that to the phosphor scattered portion 401. The phosphor scattered portion 401 is located above the LED chip 20. The area of the phosphor scattered portion 401 is smaller than that of the encapsulant layer 30 which is attached to the phosphor layer 40; in other words, the area of the phosphor scattered portion 401 is smaller than that of a light emitting area of the light radiating out of the encapsulant layer 30.

Since the clear portions 402 contain no phosphor therein, the light through the clear portions 402 will not be reflected or diffused by phosphor, and a total internal reflection ratio of the light is decreased. Thus, a light emitting efficiency of the LED package is improved.

A plurality of micro grooves can be formed on the top (or a bottom) of the phosphor layer 40, as shown in FIGS. 2 and 3. The micro grooves can also destroy the total internal reflection of the light, and further improve the light emitting efficiency of the LED package.

The heat of the LED chip 20 is prevented from affecting the phosphor layer 40 by separating the phosphor layer 40 from the LED chip 20. The phosphor layer 40 can also be separated from the encapsulant layer 30 in an alternative embodiment.

Figure 4:
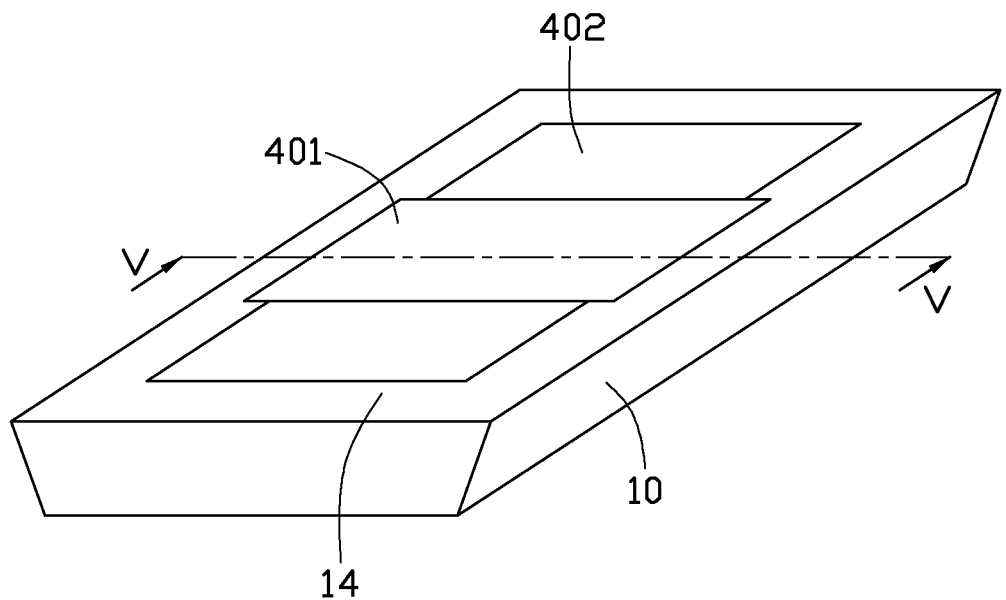
FIG. 4 is an isometric view of an LED package in accordance with a second embodiment of the present disclosure.
Figure 5:
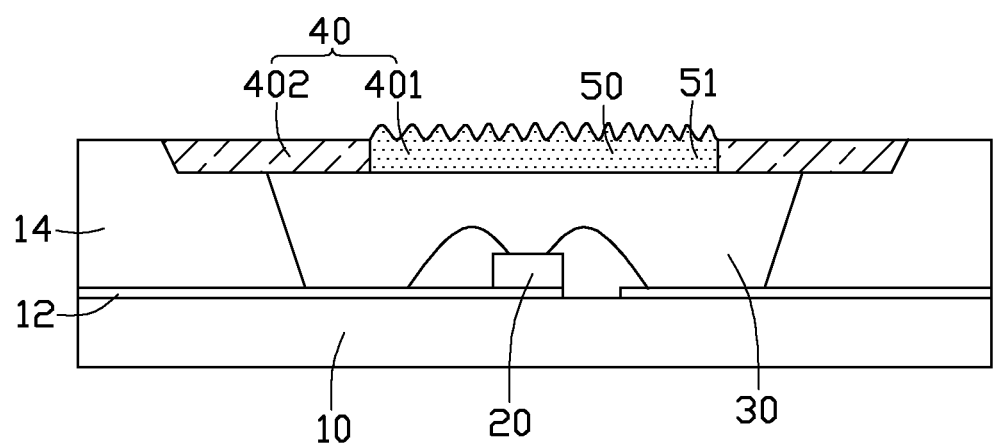
FIG. 5 is a cross sectional view of the LED package in FIG. 4, taken along line V-V thereof.

Referring to FIGS. 4-5, an LED package in accordance with a second embodiment of the present disclosure is similar to that of the first embodiment, the only difference is that the phosphor scattered portion 401 of the phosphor layer 40 comprises at least two types of phosphors 50, 51, such as red phosphor and yellow phosphor. The phosphors 50, 51 can emit wavelength conversion light with different wavelengths by converting the wavelength of the excited light from the LED chip 20. Thus, the light emitted from the LED package can have an improved color index.

Figure 6:
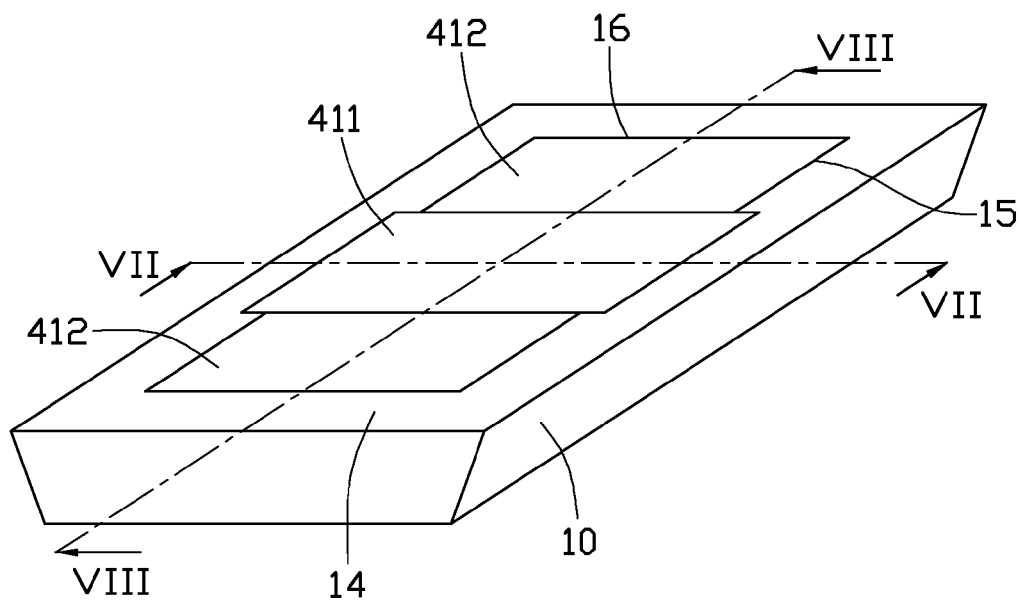
FIG. 6 is an isometric view of an LED package in accordance with a third embodiment of the present disclosure.
Figure 7:
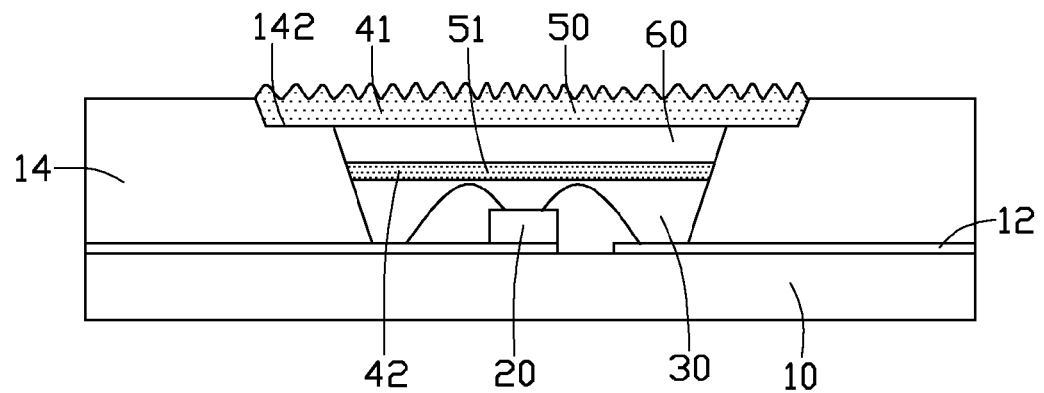
FIG. 7 is a cross sectional view of the LED package in FIG. 6, taken along line VII-VII thereof.
Figure 8:
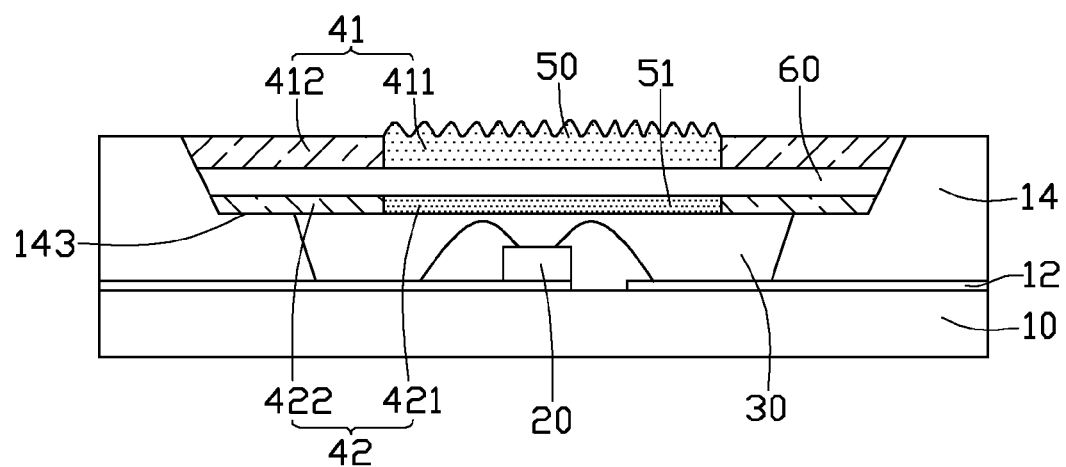
FIG. 8 is a cross sectional view of the LED package in FIG. 6, taken along line VIII-VIII thereof.

Referring to FIGS. 6-8, an LED package in accordance with a third embodiment of the present disclosure is illustrated. Compared with the LED package of the second embodiment, the difference therebetween is the position and manner of the phosphor layer.

A first step 142 is formed at two opposite lateral sides 15 of the reflection cup 14. Middle portions of the first step 142 is wider than other portions thereof. A second step 143 is formed at two other opposite lateral sides 16 of the reflection cup 14. The first step 142 is located near a top of the reflection cup 14, and the second step 143 is located approximately at a middle of the reflection cup 14; namely, the second step 143 is located below the first step 142. The encapsulant layer 30 covers the LED chip 20. A top of the encapsulant layer 30 is flush with the second step 143.

The phosphor layer comprises a first phosphor layer 41 and a second phosphor layer 42. The first phosphor layer 41 is located on the first step 142. A top of the first phosphor layer 41 is approximately flush with the top of the reflection cup 14. The second phosphor layer 42 is located on the second step 143. The first and second phosphor layers 41, 42 are separated from each other and a gap 60 is defined therebetween. The first phosphor layer 41 comprises a phosphor scattered portion 411 and clear portions 412. The second phosphor layer 42 comprises a phosphor scattered portion 421 and clear portions 422. The phosphors 50 contained in the phosphor scattered portion 411 of the first phosphor layer 41 is different from the phosphors 51 contained in the phosphor scattered portion 421 of the second phosphor layer 42. The phosphors 50, 51 are scattered in the two phosphor layers 41, 42 for avoiding interference from each other. The first and second phosphor layers 41, 42 are parallel to each other, and the phosphor scattered portion 411 of the first phosphor layer 41 is over the phosphor scattered portion 421 of the second phosphor layer 42, which are both located over the LED chip 20.

Figure 9:
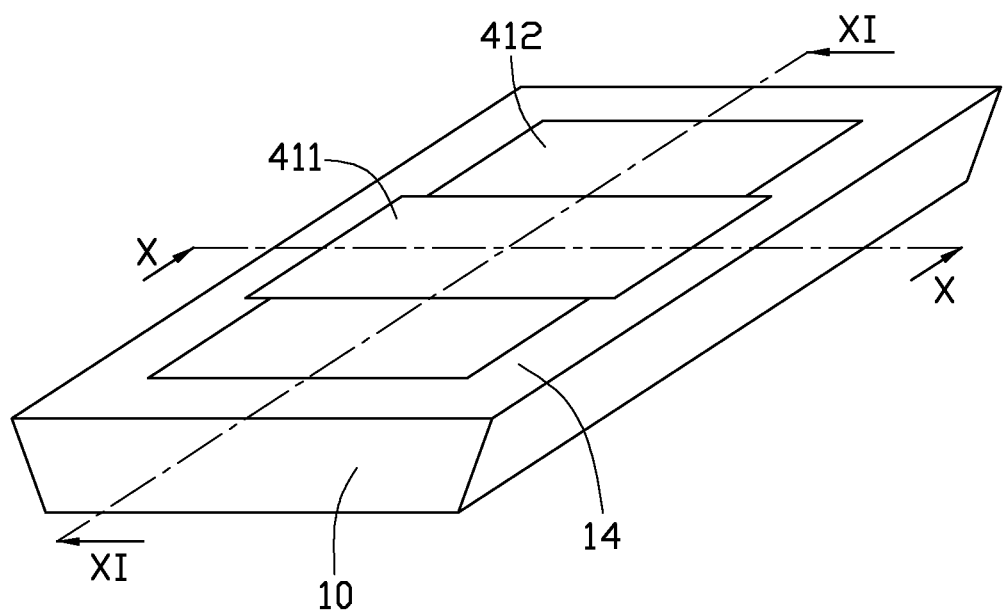
FIG. 9 is an isometric view of an LED package in accordance with a fourth embodiment of the present disclosure.
Figure 10:
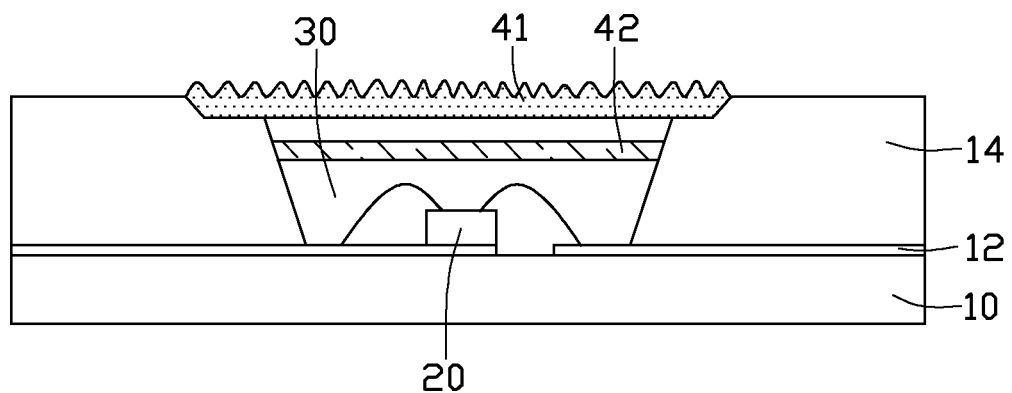
FIG. 10 is a cross sectional view of the LED package in FIG. 9, taken along line X-X thereof.
Figure 11:
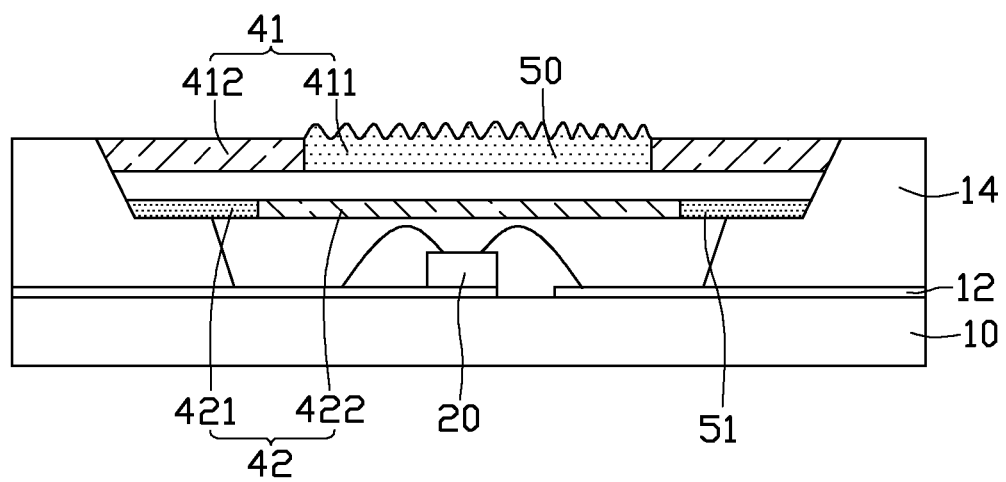
FIG. 11 is a cross sectional view of the LED package in FIG. 9, taken along line XI-XI thereof.

Referring to FIGS. 9-11, an LED package in accordance with a fourth embodiment of the present disclosure is illustrated. Compared with the LED package of the third embodiment, the difference therebetween is that the phosphor scattered portion 411 of the first phosphor layer 41 and the phosphor scattered portion 421 of the second phosphor layer 42 are staggered in the LED package of the present embodiment. Specifically, the phosphor scattered portion 411 of the first phosphor layer 41 is located over the LED chip 20. The phosphor scattered portion 421 of the second phosphor layer 42 is located at a top side of the LED chip 20 and beside the phosphor scattered portion 411 of the first phosphor layer 41. The phosphor scattered portions 411, 421 which are staggered can be excited adequately by the light from the LED chip 20 to improve a wavelength converting efficiency.

It is believed that the present embodiments and their advantages will be understood from the foregoing description, and it will be apparent that various changes may be made thereto without departing from the spirit and scope of the disclosure or sacrificing all of its material advantages, the examples hereinbefore described merely being preferred or exemplary embodiments of the disclosure.

What is claimed is:

1. A light emitting diode (LED) package comprising:
   a base with electrical structures formed thereon;
   an LED chip mounted on the base and electrically connected to the electrical structures;
   an encapsulant layer encapsulating the LED chip; and
   a phosphor layer located above and separated from the LED chip, the phosphor layer comprising a phosphor scattered portion and a clear portion without phosphor scattered therein, an area of the phosphor scattered portion being smaller than a light emitting area of the encapsulant layer from which light emitted from the LED chip leaves the encapsulant layer, the light emitted from the LED chip travelling upwardly to an outside of the LED package.

2. The LED package of claim 1 further comprising a reflection cup formed on the base, the encapsulant layer being received in the reflection cup, and the phosphor layer being positioned on the encapsulant layer and the reflection cup.

3. The LED package of claim 1, wherein the phosphor scattered portion of the phosphor layer contains at least two types of phosphors.

4. The LED package of claim 1, wherein the phosphor layer defines a plurality of micro grooves on a surface thereof.

5. The LED package of claim 1, wherein the phosphor layer comprises a first phosphor layer and a second phosphor layer, the first and second phosphor layers each comprises a phosphor scattered portion and a clear portion without phosphor scattered therein.

6. The LED package of claim 5, wherein the phosphor scattered portions of the first and second phosphor layers are staggered from each other.

7. The LED package of claim 5, wherein the phosphor scattered portion of the first second phosphor layer is over the phosphor scattered portion of the second phosphor layer.

8. The LED package of claim 5, wherein materials of phosphors contained in the first and second phosphor layers are different from each other.

9. The LED package of claim 1, wherein a light emitting layer of the LED chip is made of a material presented by $Ga_{1-x-y}In_xAl_yN$, wherein $0 \leq x \leq 1$, $0 \leq y \leq 1$, $0 \leq x+y \leq 1$.

10. An LED package comprising:
   a base with electrical structures formed thereon;
   a reflection cup formed on the base;
   an LED chip positioned at a bottom of the reflection cup and electrically connected to the electrical structures;
   an encapsulant layer received in the reflection cup and encapsulating the LED chip; and
   a phosphor layer located above and separated from the LED chip and comprising a phosphor scattered portion and two clear portions located at two opposite sides of the phosphor scattered portion, wherein an area of the phosphor scattered portion is smaller than a light emitting area of the encapsulant layer from which light emitted from the LED chip leaves the encapsulant layer, the light emitted from the LED chip travelling upwardly to an outside of the LED package.

11. The LED package of claim 10, wherein the phosphor scattered portion contains at least two types of phosphors, and the clear portions contain no phosphor therein.

12. The LED package of claim 10, wherein a step is defined in a top inner side of the reflection cup, and the phosphor layer is positioned on the step.

13. The LED package of claim 12, wherein an additional step is defined in the reflection cup, an additional phosphor layer is positioned on the additional step and the encapsulant layer, the additional phosphor layer comprising a phosphor scattered portion and a clear portion.

14. The LED package of claim 13, wherein the phosphor scattered portions of the phosphor layer and the additional phosphor layer are staggered from each other.

15. The LED package of claim 13, wherein the phosphor scattered portion of the phosphor layer is over the phosphor scattered portion of the additional phosphor layer.

* * * * *